United States Patent
Lin et al.

(10) Patent No.: US 12,317,488 B2
(45) Date of Patent: May 27, 2025

(54) STRUCTURE AND METHOD FOR PREVENTING SILICIDE CONTAMINATION DURING THE MANUFACTURE OF MICRO-PROCESSORS WITH EMBEDDED FLASH MEMORY

(71) Applicant: Taiwan Semiconductor Manufacturing Co., Ltd., Hsinchu (TW)

(72) Inventors: Meng-Han Lin, Hsinchu (TW); Wei Cheng Wu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/346,056

(22) Filed: Jun. 30, 2023

(65) Prior Publication Data

US 2023/0354600 A1 Nov. 2, 2023

Related U.S. Application Data

(62) Division of application No. 17/094,758, filed on Nov. 10, 2020, now Pat. No. 11,706,917, which is a
(Continued)

(51) Int. Cl.
*H10B 41/47* (2023.01)
*H01L 21/285* (2006.01)
(Continued)

(52) U.S. Cl.
CPC ....... *H10B 41/47* (2023.02); *H01L 21/28518* (2013.01); *H01L 21/30625* (2013.01);
(Continued)

(58) Field of Classification Search
CPC ........ H10B 41/47; H10B 41/30; H10B 99/00; H10B 43/35; H10B 41/00;
(Continued)

(56) References Cited

U.S. PATENT DOCUMENTS

| 5,466,622 A | 11/1995 | Cappelletti |
| 6,765,258 B1 * | 7/2004 | Wu ..................... H01L 29/7883 257/315 |

(Continued)

FOREIGN PATENT DOCUMENTS

| KR | 2002-0022232 A | 3/2002 |
| KR | 10-2005-0046536 A | 5/2005 |

(Continued)

*Primary Examiner* — Yasser A Abdelaziez
(74) *Attorney, Agent, or Firm* — Seed IP Law Group

(57) ABSTRACT

A method is provided in which a monitor cell is made that is substantially identical to the flash memory cells of an embedded memory array. The monitor cell is formed simultaneously with the cells of the memory array, and so in certain critical aspects, is exactly comparable. An aperture is formed that extends through the control gate and intervening dielectric to the floating gate of the monitor cell. To prevent silicide contamination during a subsequent CMP process, a silicide protection layer (SPL), such as a resist protective oxide, is formed over exposed portions of the control gate prior to formation of a silicide contact formed on the floating gate. The SPL is formed simultaneously with existing manufacturing processes to avoid additional process steps.

20 Claims, 13 Drawing Sheets

Related U.S. Application Data division of application No. 16/282,045, filed on Feb. 21, 2019, now Pat. No. 10,868,027.

(60) Provisional application No. 62/697,732, filed on Jul. 13, 2018.

(51) Int. Cl.

| | | |
|---|---|---|
| *H01L 21/306* | (2006.01) | |
| *H01L 29/423* | (2006.01) | |
| *H01L 29/66* | (2006.01) | |
| *H01L 29/788* | (2006.01) | |
| *H10B 41/30* | (2023.01) | |

(52) U.S. Cl.
CPC .. *H01L 29/42328* (2013.01); *H01L 29/66825* (2013.01); *H01L 29/788* (2013.01); *H10B 41/30* (2023.02)

(58) Field of Classification Search
CPC ......... H01L 21/28518; H01L 21/30625; H01L 29/42328; H01L 29/788; H01L 29/40114; H01L 22/34; H01L 21/304; H01L 21/76; H01L 21/768; H01L 21/78; H01L 29/66825; G11C 29/22; G11C 29/006; G11C 29/04; G11C 2029/0403
See application file for complete search history.

(56) References Cited

U.S. PATENT DOCUMENTS

| | | | |
|---|---|---|---|
| 9,431,253 B1* | 8/2016 | Tan | H01L 21/823412 |
| 9,583,640 B1 | 2/2017 | Richter et al. | |
| 2006/0079054 A1 | 4/2006 | Choi et al. | |
| 2007/0023822 A1 | 2/2007 | Sung et al. | |
| 2009/0142918 A1 | 6/2009 | Liu et al. | |
| 2010/0157679 A1 | 6/2010 | Sommer | |
| 2010/0252874 A1 | 10/2010 | Schulz et al. | |
| 2014/0091381 A1 | 4/2014 | Lee | |
| 2014/0151699 A1 | 6/2014 | Wu et al. | |
| 2016/0013198 A1 | 1/2016 | Liu | |
| 2016/0149007 A1* | 5/2016 | Chou | H01L 29/407 |
| | | | 257/339 |
| 2016/0365456 A1 | 12/2016 | Liu et al. | |
| 2017/0032971 A1 | 2/2017 | Pan et al. | |
| 2017/0062448 A1* | 3/2017 | Kitajima | H01L 29/42328 |
| 2017/0330889 A1 | 11/2017 | Richter et al. | |
| 2017/0345834 A1 | 11/2017 | Melde | |
| 2018/0006048 A1 | 1/2018 | Tsukamoto et al. | |
| 2018/0294359 A1* | 10/2018 | Chen | H01L 29/7881 |

FOREIGN PATENT DOCUMENTS

| | | |
|---|---|---|
| KR | 10-2006-0031473 A | 4/2006 |
| KR | 100859081 B1 | 9/2008 |
| KR | 10-2015-0141990 A | 12/2015 |
| TW | I615922 B | 2/2018 |
| TW | 201813059 A | 4/2018 |

* cited by examiner

FIG. 1

STRUCTURE AND METHOD FOR PREVENTING SILICIDE CONTAMINATION DURING THE MANUFACTURE OF MICRO-PROCESSORS WITH EMBEDDED FLASH MEMORY

BACKGROUND

Flash memories have some particular advantages and benefits, as compared to other types of solid-state non-volatile memory structures. Many of these advantages and benefits are related, for example, to improved read, write, and/or erase speeds, power consumption, compactness, cost, etc. Flash memories are commonly used in high-density data storage devices configured for use with cameras, cell phones, audio recorders, portable USB data storage devices—often referred to as thumb drives or flash drives—etc. Typically, in such applications, a flash memory is manufactured on a dedicated microchip, which is then coupled with another chip or chips containing the appropriate processor circuits, either together in a single package, or in separate packages configured to be electrically coupled.

Processors with embedded flash memories are a more recent development. In such devices, a flash memory array is manufactured together with logic and control circuitry on a single chip. This arrangement is often used in microcontroller units (MCU), i.e., small computer devices integrated onto single chips, which are typically designed to repeatedly perform a limited number of specific tasks. MCUs are often used in smart cards, wireless communication devices, control units for automobiles, etc. Integration of memory with related processing circuitry can improve processing speed while reducing package size, power consumption, and cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a diagrammatic side sectional view of a portion of a semiconductor device, such as, e.g., a microcontroller unit, during manufacture, according to an embodiment.

FIGS. 5A-5D are diagrammatic side sectional views of a wafer at respective stages of the manufacturing process, according to an embodiment, in which FIG. 5A shows the wafer at a manufacturing stage that is later in the process than the stage depicted in FIG. 4A, while the stages shown in FIGS. 5B and 5C correspond, respectively, to the stages shown in FIGS. 4B and 4C. FIG. 5D shows the monitor cell of FIGS. 5A-5C at a stage that corresponds to the manufacturing stage shown in FIG. 1.

DETAILED DESCRIPTION

Figure 2B:
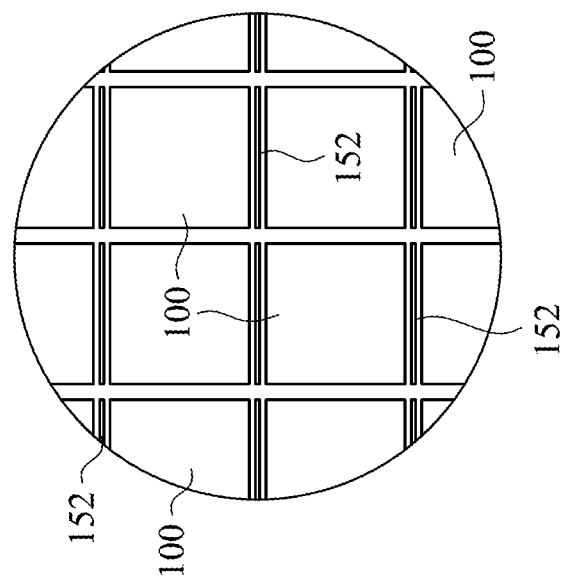
FIG. 2B is an enlarged view of a portion 2B of the wafer 106 of FIG. 2A, showing additional detail, according to an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the drawings, some elements are designated with a reference number followed by a letter, e.g., "704*a*, 704*b*." In such cases, the letter designation is used where it may be useful in the corresponding description to refer to or to differentiate between specific ones of a number of otherwise similar or identical elements. Where the description omits the letter from a reference, and refers to such elements by number only, this can be understood as a general reference to any or all of the elements identified by that reference number, unless other distinguishing language is used.

A microcontroller unit (MCU) typically includes a number of discrete devices, such as, e.g., a central processing unit (CPU) core, static random access memory (SRAM) arrays (or modules), flash memory modules, a system integration module, a timer, an analog-to-digital converter (ADC), communication and networking modules, power management modules, etc. Each of these devices, in turn, comprises a number of passive and active electronic components, such as, e.g., resistors, capacitors, transistors, and diodes. A large number of these components, particularly the active components, are based on various types of field effect transistors (FET). In a FET, conductivity in a channel region extending between source and drain terminals is controlled by an electric field in the channel region, produced by a voltage difference between a control gate and the body of the device.

Figure 1:
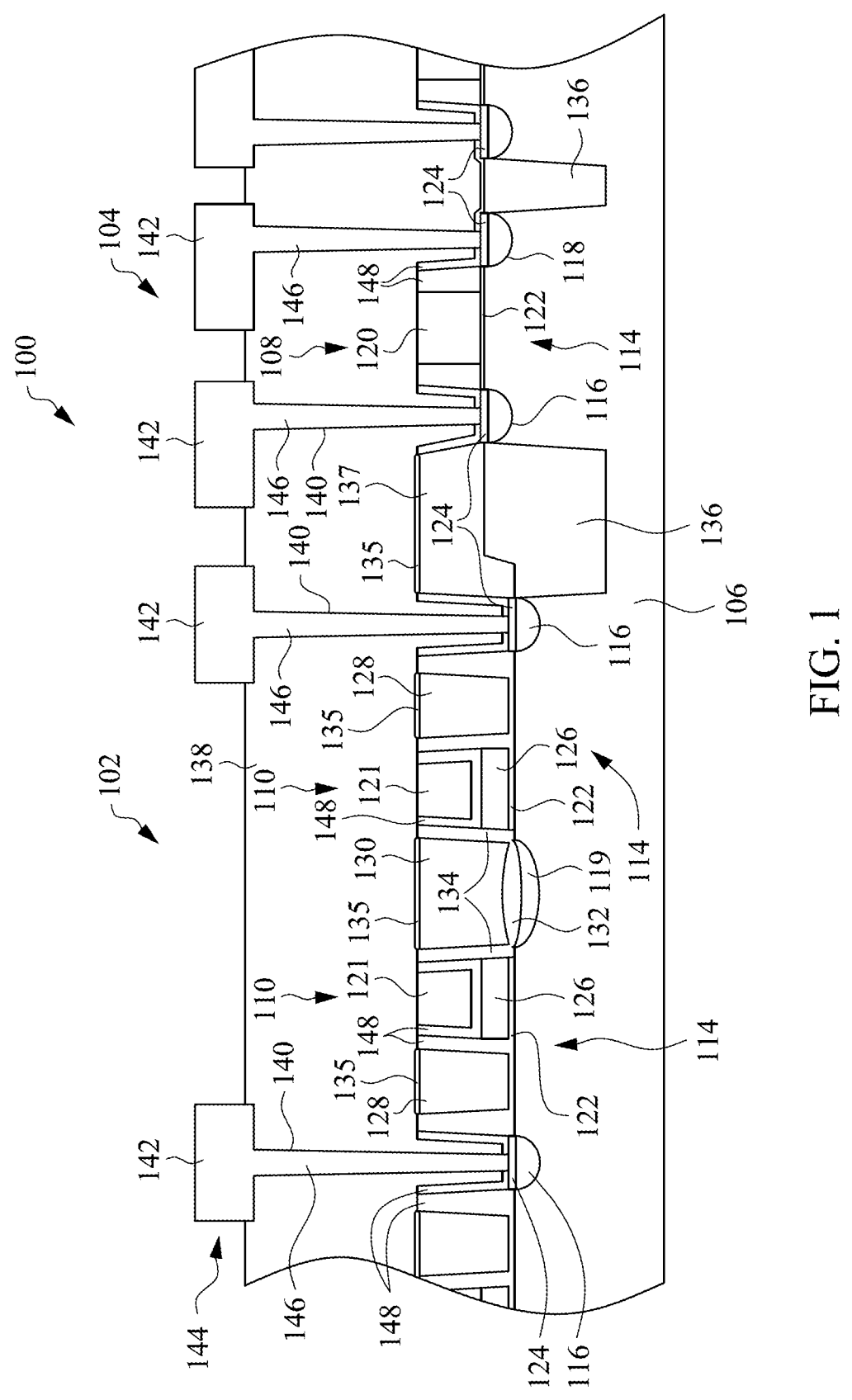

FIG. 1 is a diagrammatic side sectional view of a portion of a device 100, such as, e.g., an MCU, during manufacture, according to an embodiment. The device 100 includes a flash memory array 102 and a processor 104 formed on a semiconductor wafer 106. The processor 104 includes a transistor 108 that is part of a logic circuit, while the memory array 102 includes a pair of flash memory cells 110.

The transistor 108 includes a channel region 114 extending between a drain region 116 and a source region 118. A control gate 120 is isolated from the channel region 114 by a gate dielectric 122, and silicide contact terminals 124 are formed over the drain and source regions 116, 118.

The flash memory cells 110 include respective channel regions 114 extending below the corresponding floating gate 126 and select gate 128, a respective drain 116 and they share a common source region 119. Each flash memory cell 110 includes a control gate 121, a floating gate 126 positioned between the control gate and the channel region 114, and a select gate 128 adjacent to the control and floating gates. A gate dielectric 122 separates the channel regions 114 from the respective floating and select gates 126, 128. The pair of flash memory cells shares a common erase gate 130 that is separated from the source region 119 by a dielectric oxide region 132. Each of the floating gates 126 is separated from the erase gate 130 by a tunnel oxide layer 134. Isolation trenches 136 and polysilicon dummy walls 137 separate regions of the device 100 that have different types or levels of conductivity. Additional silicide contact terminals 135 are formed on upper surfaces of the select gates 128, the erase gates 130, and the strap (not shown in FIG. 1) of the control gate 121.

An interlayer dielectric (ILD) 138 layer extends over the wafer 106, and vias 140 extend from an upper surface of the interlayer dielectric to the silicide contact terminals 124. Electrical traces 142 formed in a first metal layer 144 are coupled to respective ones of the silicide contact terminals 124 by metal connectors 146 formed in the vias 140.

While connections are not shown for each component, it will be understood that in practice, connections are provided for the control gates 120, 121, the common source region 119, the select gates 128, the common source region 119, etc., placing each component in electrical contact with the appropriate circuitry. In some cases, the connections are by way of a metal layer, similar to those shown. In other cases, the connections are formed on or over the substrate 106. Only the floating gates 126 are completely isolated from direct electrical contact with other components and circuits of the device 100.

Various layers of material, 148 are shown in general outline, which are not configured to act as conductors or semiconductors in the device 100. These layers may comprise dielectrics, resist overlays, passivation layers, etch stop layers, spacers, etc.

As noted above, the logic transistor 108 operates by applying an electric field over the channel region 114, thereby changing the conductivity of the channel region. The electric field is produced by application of a voltage potential between the control gate 120 and the semiconductor body 106. A FET can be configured either to increase or decrease conductivity when an electric field of a selected polarity is present. Typically, transistors in a logic circuit are designed to function like switches, turning on or off in response to an electric field with a selected strength, and controlling.

In the memory cells 110, during a write operation, electrons can be forced to tunnel through the gate dielectric 122 to the floating gate 126, where they can remain trapped indefinitely, by applying a write voltage to the control gate 121 while generating an electric current in the channel region 114. If there is a sufficient number of electrons trapped on the floating gate 126, the electrons can block an electric field produced by the control gate 121, preventing the control gate from acting to change conductivity in the channel region 114. Thus, the presence of electrons can be detected by applying a voltage potential across the drain and source regions 116, 119 while applying a read voltage to the control gate 121 to produce an electric field, and testing for a current flow in the channel region 114. Typically, a binary value of one is the default setting of a flash memory cell at the time of manufacture and before programming, while a binary value of zero is indicated if channel current is unaffected by a read voltage at the control gate 121. A binary zero value on a flash memory cell can be erased—i.e., returned to a one—by applying a sufficiently powerful erase voltage to the erase gate 130. This causes electrons trapped on the floating gates 126 of both of the memory cells 110 to tunnel out through the tunnel oxide layers 134 to the erase gate 130. In practice, there would be many more memory cells adjacent to the erase gate 130, extending along rows lying perpendicular to the view of FIG. 1. During an erase operation, each of those memory cells would be erased simultaneously—i.e., in a flash—hence the term flash memory.

The term tunneling is used herein to refer to any process by which electrons are moved through a dielectric layer to or from a floating gate, including, for example, fowler-Nordheim tunneling, quantum tunneling, hot electron injection, etc.

As advances in technology enable ever smaller and more compact devices, power and voltage requirements are reduced, and speed increases. However, a problem that has arisen with the reduction in size is that previously negligible variations in the thickness or quality of either the gate dielectric 122 or the tunnel oxide 134 can significantly affect the operational parameters of the cells.

This is particularly the case at technology nodes below 65 nm, 40 nm, and 28 nm scales. As a result, it has become necessary to subject newly manufactured devices to extensive testing to determine appropriate voltage levels for read, write, and erase operations. This is a time-consuming operation because the floating gates 126 are completely isolated, so it is impossible to simply apply a voltage and measure the effect. Instead, repeated read, write, and erase operations must be performed at different voltage and time setting, in order to produce sufficient data to deduce the appropriate values for the chips of a given wafer.

Figure 2A:
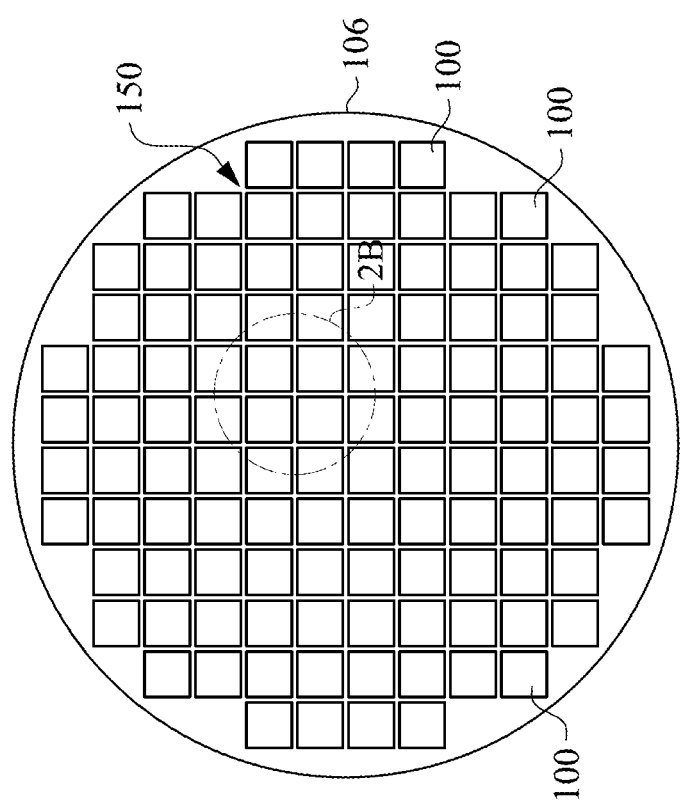
FIG. 2A is a diagrammatic plan view of a semiconductor wafer 106 on which a plurality of the devices of FIG. 1 are formed.
Figure 3:
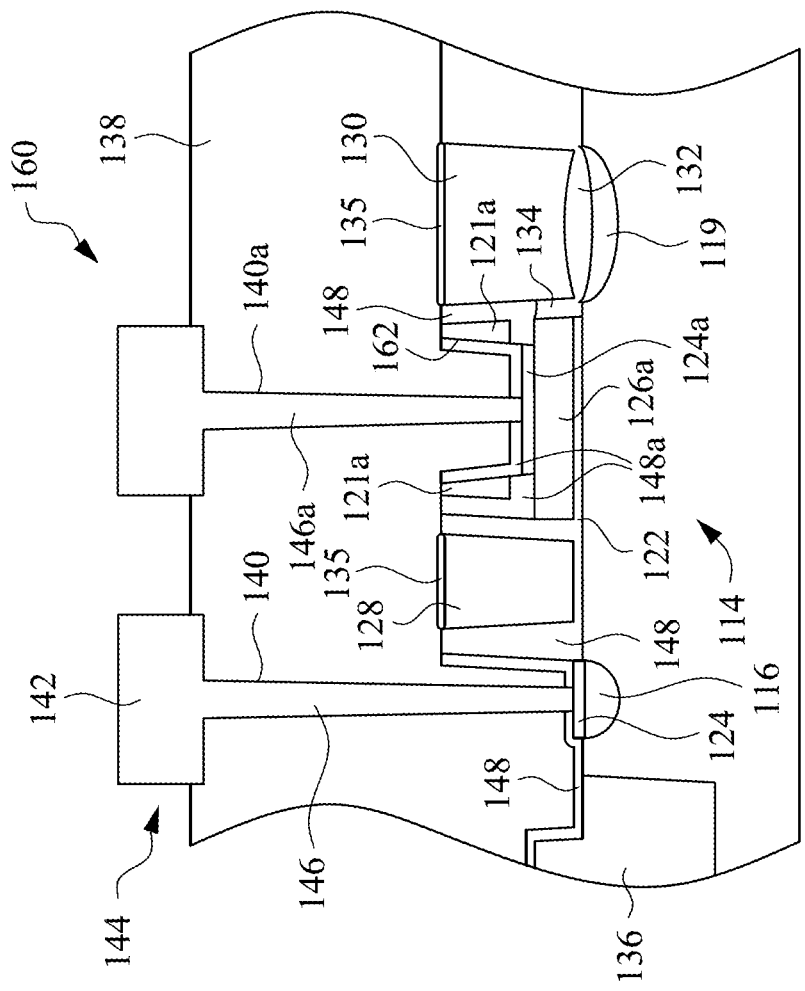
FIG. 3 is a diagrammatic side sectional view of a monitor cell, according to an embodiment.

One solution has been proposed, as described with reference to FIGS. 2A, 2B, and 3. FIG. 2A is a diagrammatic plan view of a semiconductor wafer 106 on which a plurality of the devices 100 of FIG. 1 are formed. FIG. 2B is an enlarged view of a portion 2B of the wafer 106 of FIG. 2A, showing additional detail, according to an embodiment. The devices 100 are separated by scribe lines 150 along which the wafer 106 will be cut to produce the individual microchips. The scribe lines 150 include the kerf of a saw that will be used to separate the wafer 106 into dice, or chips 100, and thus define the chips on the wafer. The material removed by the saw, and the material surrounding the devices 100 will be discarded as waste following the separation process. However, it is common practice to form additional devices and circuits 152 in the scribe lines 15 as indicated in FIG. 2B. These devices are typically referred to as process control monitor (PCM) test keys, and are used for monitoring various functions and processes during manufacturing, to ensure proper operability of the chips 100. Such devices may be employed to monitor, for example, threshold voltages, saturation current, off current, breakdown voltage, back-end processes, capacitances and resistances, etc. It has been proposed to form one or more monitor cells in the PCM test keys 152, as described below. FIG. 3 is a diagrammatic side sectional view of a monitor cell 160, according to an embodiment of the proposed solution. The monitor cell 160 is formed on the wafer 106 in one or more of the test keys 152, for example. Elements of the monitor cell 160 are formed simultaneously with the formation of similar elements of the memory cells 110 of the device 100, of FIG. 1, and the monitor cell is, in most respects, identical to the memory cells. During formation of the memory cells 110, the same processes are used to simultaneously form substantially identical structures in the monitor cell 160, including, e.g., a channel region 114, source and drain regions 116, 119, gate dielectric 122, tunnel oxide 134, a floating gate 126a, a control gate 121a, etc. However, after formation of the control gate 121a, an aperture 162 is etched through the control gate and the intervening dielectric layer 148a to expose a portion of the surface of the floating gate 126a.

The term simultaneous is used herein to refer to multiple processing tasks that are performed at the same time, and by the same processing step or steps. If, for example, the gate dielectric layers 122 for each of a plurality of memory cells 110 are formed by the deposit of a single dielectric layer over at least the portion of the wafer 106 where those memory cells will be located, and then patterned to define the individual gate dielectric layers 122, the gate dielectric layers can be described as having been formed simultaneously. Likewise, if the gate dielectric layer 122a is formed from the same single dielectric layer as the gate dielectric layers 122 of the memory cells 110, and patterned by the same process, then the gate dielectric layer of the monitor cell 160 can be described as having been formed simultaneously with the gate dielectric layers of the memory cells.

Continuing to refer to FIG. 3, a metal silicide contact 124a is formed on the surface of the floating gate 126a, and when the vias 140 are later formed in the memory array 102 and processor 104, an additional via 140a and connector 146a are formed in the monitor cell 160 over the floating gate 126a, placing the floating gate 126a in contact with electrical traces 142 of the first metal layer 144. According to an embodiment, the floating gate 126a is placed in electrical contact with a contact pad formed in one of the metal layers, where it is accessed before completion of the wafer, for testing. According to another embodiment, the floating gate 126a is eventually placed in electrical contact, via electrical connections in various additional metal layers, with contact pads at the uppermost surface of the wafer 200. This permits access to the floating gate 126a for performance of various appropriate tests prior to the wafer being separated into individual chips. Alternatively, the monitor cell 160 is separated from the wafer 106 as part of a small additional microchip, with limited circuitry, which can be tested while the remaining devices 100 are further processed and packaged. According to further embodiments, a monitor cell 160 is formed on each semiconductor die, such as, e.g., as by modifying one memory cell 110 of an array of cells, for that purpose.

According to an embodiment, the steps forming the silicide contact 124a, the via 140a, and the connector 146a are performed simultaneously with formation of the silicide contacts 124, vias 140, and connectors 146 of the memory cells 110. Likewise, even though the memory cells 110 do not include structures that are analogous to the aperture 162, there are many processes, apart from those used to form the memory arrays 102, that are employed in the formation of other components of the devices 100, including a number of etching processes. According to an embodiment, the aperture 162 is formed simultaneously with the performance of processes for the manufacture of other components of the device 100.

At a later stage of the manufacturing process, tests are performed, in which voltages of varying values and combinations are applied to the source and drain regions 116, 119, and the floating and erase gates 126a, 130, to create the conditions for write and erase procedures. By doing so, the floating gate 126a can be energized, and density of electron flow measured, directly, to determine whether the insulating oxides meet the device specifications, and to establish the appropriate read, write, and erase voltages.

Because the monitor cell 160 is formed simultaneously with the memory arrays 102 of the devices 100, in some embodiments, most of the elements of the monitor cell, including the tunneling dielectrics 122, 134—are essentially identical with the corresponding elements of the memory cells 110, and share the same characteristics, except, of course, that the control gate 121a is not operative. Furthermore, no additional production costs are added, the only expense being the initial modification of the appropriate masks and tooling. On the other hand, the simplified testing procedure will reduce the cost of every wafer produced.

In FIG. 3 a single monitor cell 160 is shown and described that is substantially identical in most respects to the memory cells 110 of the flash memory array 102 of the device 100. However, according to other embodiments, a plurality of monitor cells 160 are produced, as, for example, multiple individual cells, cells of a single array, or as cells or arrays of cells of multiple test keys 152, or cells or arrays spaced apart around the perimeter of the wafer 160. Additionally, according to various embodiments, cells of different sizes and/or shapes are produced. Multiple monitor cells, monitor cells of different sizes, and/or of different shapes can provide additional data relating to cell or dielectric quality or performance, etc. Finally, according to some embodiments, one or more monitor cells 160 are included on each device 100, permitting tests to be performed after the wafer 160 has been diced.

While the process described above is believed to be a very economical alternative to a relatively costly procedure, the inventors have recognized a problem associated with the proposed process that could result in a significant increase in chip rejection and reduction of performance, and that could more than offset any potential cost savings. This problem is explained below, with reference to FIGS. 4A-4C.

Figure 4A:
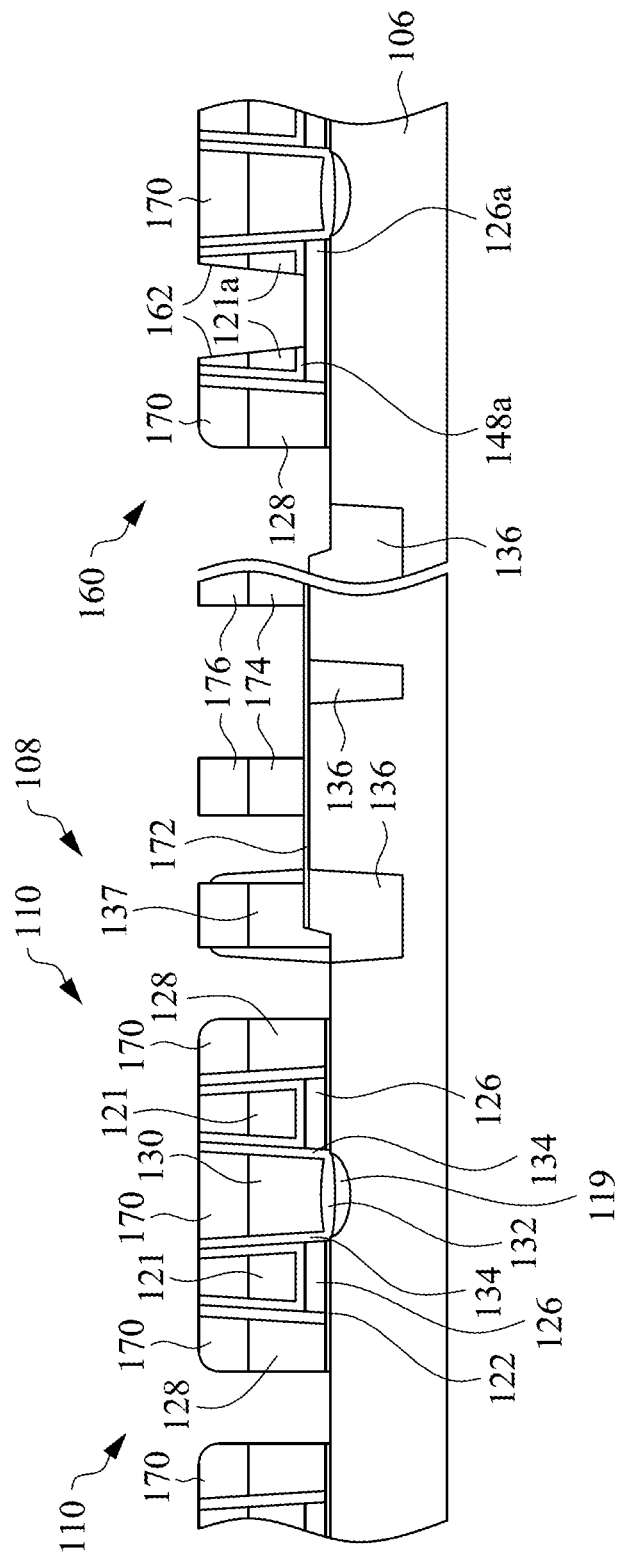
FIGS. 4A-4C are diagrammatic side sectional views of a semiconductor material wafer at respective stages of a manufacturing process, showing portions of one of a plurality of devices, like the device described above with reference to FIG. 1, and a device similar to that described with reference to FIG. 3.
Figure 4B:
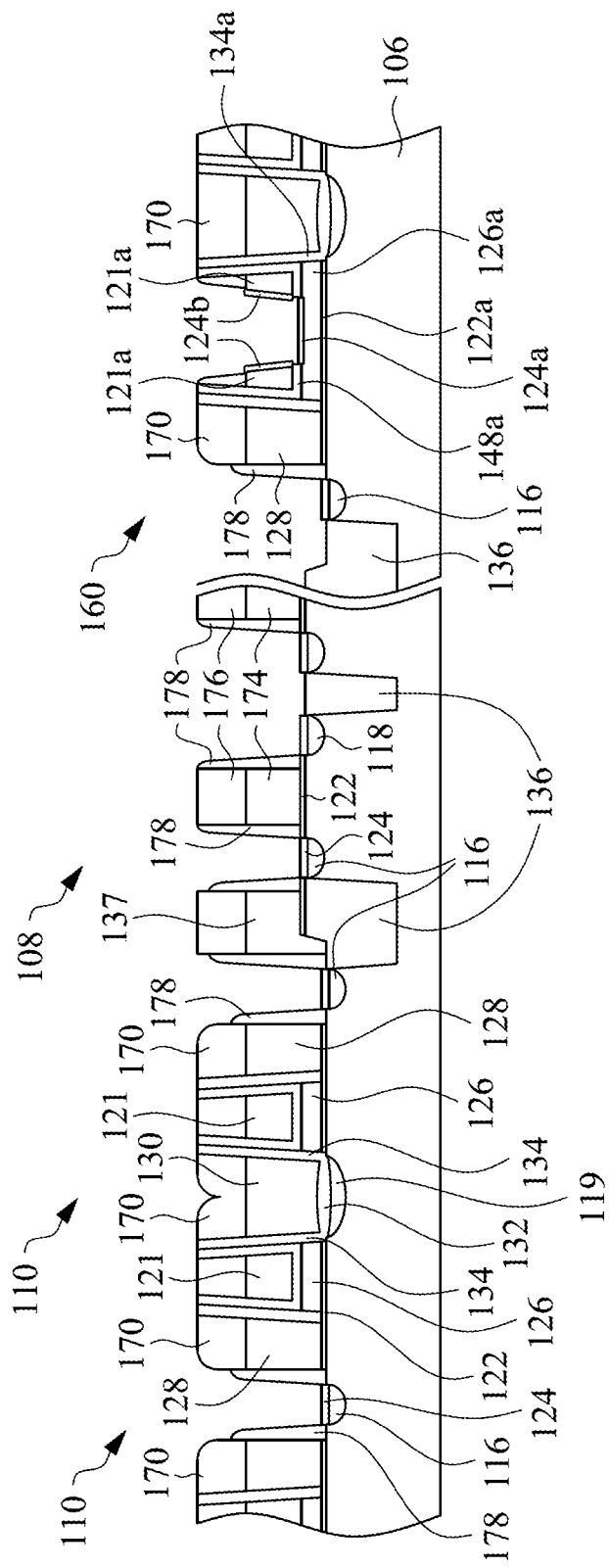
Figure 4C:
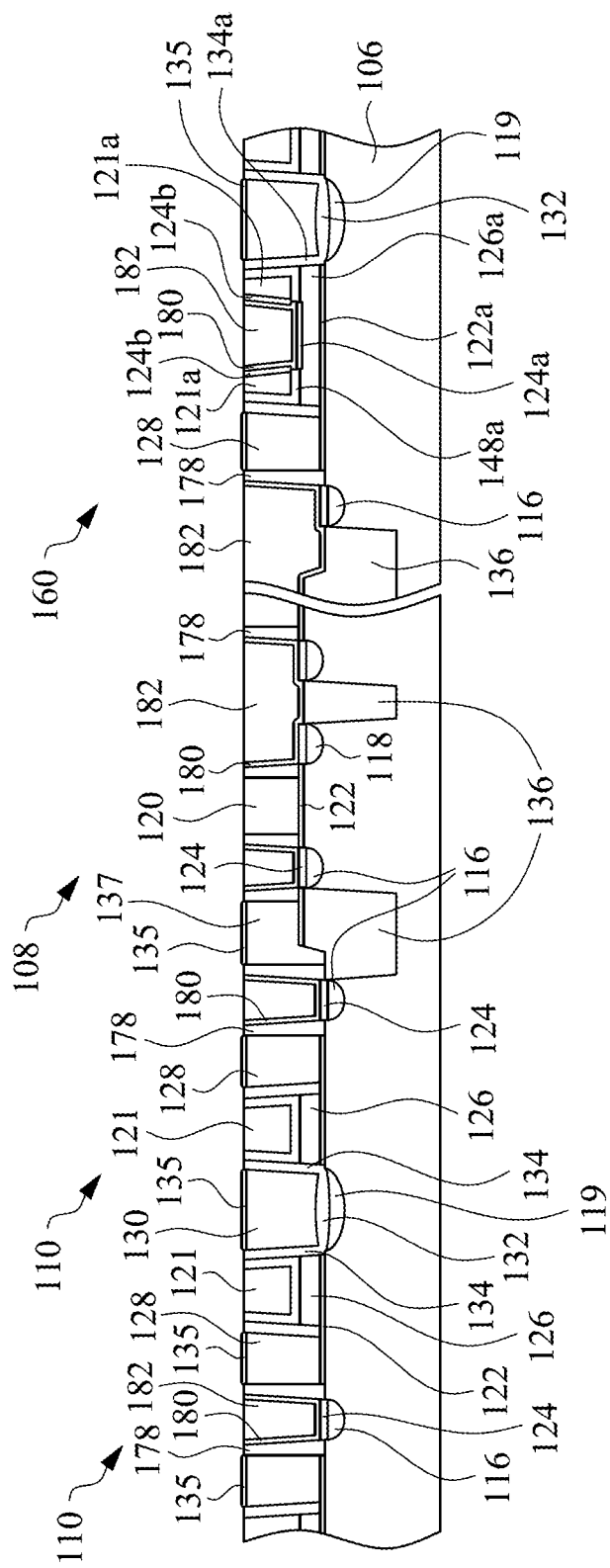

FIGS. 4A-4C are diagrammatic side sectional views of the wafer 106 at respective stages of the manufacturing process, showing portions of one of a plurality of devices 100, like the device described above with reference to FIG. 1, which are to be eventually separated as respective chips from the wafer 106. Also shown is the monitor cell 160, formed in a PCM test key 152 of the wafer 106, as described above with reference to FIGS. 2B and 3. The diagrams shown in FIGS. 4A-4C, and the corresponding description, are only isolated steps in the manufacturing process, and are not intended to provide information regarding the manufacturing process in general, but only to illustrate the nature and causes of the problem arising from the inclusion of the monitor cell 160 on the wafer 106.

At the stage shown in FIG. 4A, much of the structure of the memory cells 110 and the monitor cell 160 has been completed: the floating gates 126 are complete, along with the gate dielectric and tunnel oxide layers 122, 134. In the memory cells 110, the control, select, and erase gates 121, 128, 130 are substantially complete, and topped with hard mask caps 170. On the processor side, a dielectric layer 172 is deposited, which will be patterned to form the gate dielectric of the logic transistor 108. A dummy polysilicon gate material 174 of the logic transistor control gate and a hard mask layer 176 have been deposited and patterned—the dummy poly material will be replaced at a later stage. Up to this point, the monitor cell 160 had been substantially identical to the flash memory cells 110 of the memory array 102. However, as shown in FIG. 4A, during an etch procedure that is an element in the formation of the processor 104, an aperture 162 has been formed in the monitor cell 160, extending through the control gate 121a and an intervening dielectric layer 148a, to expose a portion of the upper surface of the floating gate 126.

Proceeding to the stage shown in FIG. 4B, spacers 178 are formed, the dielectric layer 172 is patterned to form the gate dielectric 122 of the logic transistor 108, and the control gate 120 of the logic transistor is substantially complete. Drain regions 116 of the memory cells 110 and the logic transistor are implanted, and the source regions 118 of the logic transistor is implanted. Nickel is deposited and nickel silicide contacts 124 are formed on the exposed surfaces of the drain regions 116 of the memory cells 110 and the logic transistor 108, and of the source region 118 of the logic transistor 108. In the same process, a silicide contact 124a is formed on the exposed portion of the floating gate 126a of the monitor cell 160, within the aperture 162. It will be noted that silicide deposits 124b have also formed on the surfaces of the control gate 121a that were exposed by the etch process used to access the floating gate 126a. However, these remain isolated from the silicide contact 124a and the floating gate 126a, by the dielectric 148a.

Turning now to FIG. 4C, a contact etch stop layer (CESL) 180 is formed over the components and an interlayer dielectric (ILD) 182 is deposited over the wafer 106. A chemical/mechanical polish (CMP) process is then performed, removing the hard mask caps 170, 176 and exposing surfaces of the control, select, and erase gates 120, 121, 128, 130, and bringing all of components on the wafer 106 to a common height. This produces a surface suitable for succeeding process steps. The dummy gate material 174 is removed and replaced with a metal to form the control gates 120 of the logic transistor 108. A mask is deposited and patterned, and silicide contacts 135 on the exposed upper surfaces of the select and erase gates 128, 130, the dummy polysilicon walls 137 and the strap (not shown in FIG. 4C) of the control gate 121.

It can be seen, in FIG. 4C, that when the CMP process is performed, the process removes small portions of the control gates 121. The inventors recognized, first, that the portions of the control gate 121a of the monitor cell 160 that are exposed when the aperture 162 is formed will likely form silicide deposits 124b, and, second, that when the CMP process reaches and removes a portion of the control gate 121a, it will also necessarily remove portions of the silicide deposits 124b formed thereon. This can result in silicide contamination of the surface of the wafer 106, creating some unintended consequences. For example, the polish process can carry minute particles of the silicide and distribute them over the polished surface of the wafer 106. These silicide particles are electrically conductive, and so can affect the conductivity—or resistivity—of materials they come in contact with, or produce parasitic capacitances. Additionally, the silicide can react chemically with other materials and chemicals, as the manufacturing process proceeds, producing other unexpected products and byproducts. Detection of silicide contamination is difficult and expensive, and not practical for production processes. In many cases, however, if the contaminating silicide particles are not detected before the wafer moves on to the next step in the process, defects caused by the contamination will result in the eventual rejection of the contaminated chips. This can become very expensive if a large percentage of the chips on a wafer are found to be contaminated.

Embodiments in accordance with the present disclosure can reduce or eliminate the potential for silicide contamination. As with the steps of producing the monitor cells 160, embodiments in accordance with the present disclosure for reducing or eliminating the danger of silicide contamination can be implemented using standard manufacturing processes without adding process steps.

FIGS. 5A-5D are diagrammatic side sectional views of a wafer 200 at respective stages of the manufacturing process, according to an embodiment. The wafer 200 includes a plurality of devices 100 that are substantially identical to the devices 100 described above with reference to FIGS. 1-4C, and that are produced via the same manufacturing processes. The wafer 200 also includes a monitor cell 210, formed in a PCM test key 152 of the wafer 106 in accordance with embodiments of the present disclosure.

Figure 5A:
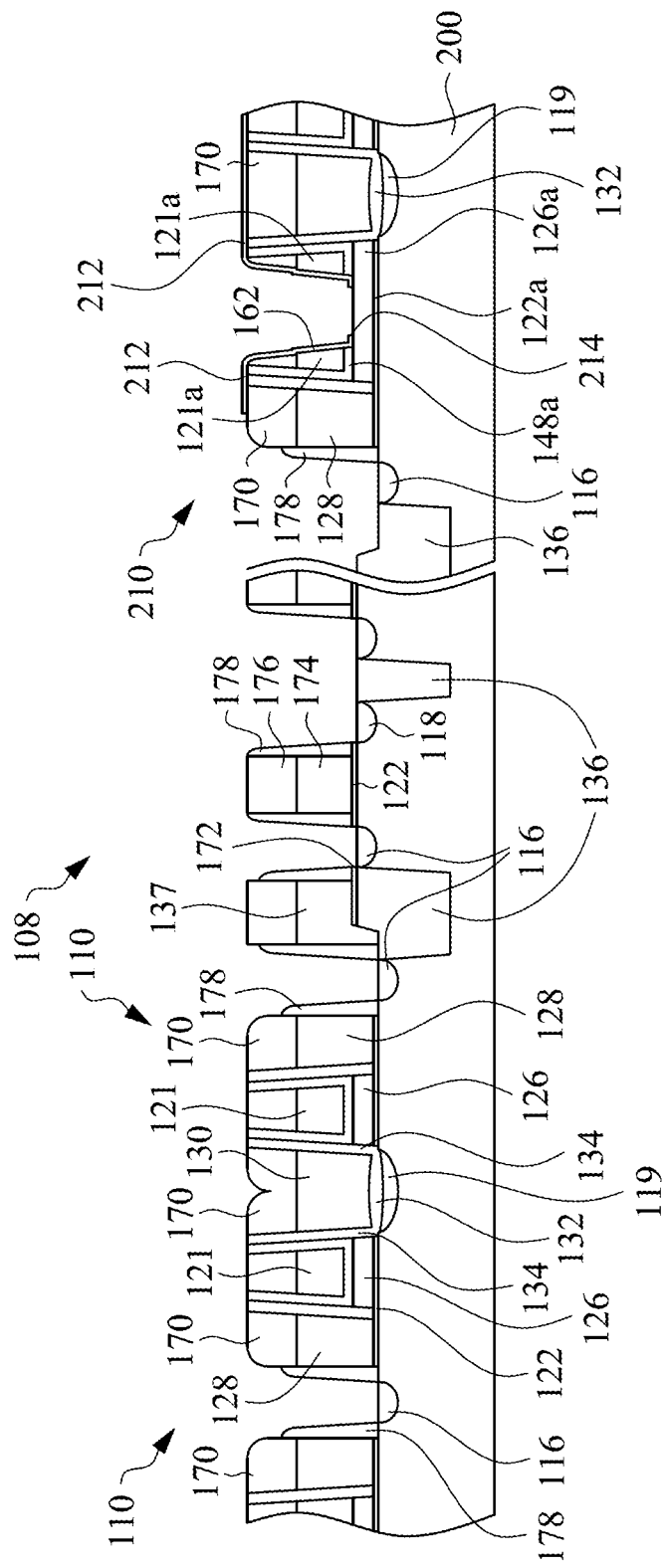

The view of FIG. 5A shows the wafer 200 at a manufacturing stage that is later in the process than the stage depicted in FIG. 4A, while the stages shown in FIGS. 5B and 5C correspond, approximately, to the stages of FIGS. 4B and 4C, respectively. FIG. 5D shows the monitor cell 210 at a stage that corresponds to the stage shown in FIG. 1. In addition to the processes completed by the stage of FIG. 4A, in FIG. 5A spacers 178 are formed, the dielectric layer 172 is patterned to form the gate dielectric 122 of the logic cell 108, and the source and drain regions 116, 118 have been implanted. Also shown in FIG. 5A is a silicide prevention layer (SPL) 212. In this example, SPL 212 is a portion of a resist protective oxide (RPO) layer that has been deposited and patterned simultaneously with the formation of other RPO layers, as part of the manufacturing process of the devices 100, and that is modified to cover the monitor cell 210, and patterned to provide a window 214 through which a portion of the floating gate 126a is exposed.

Figure 5B:
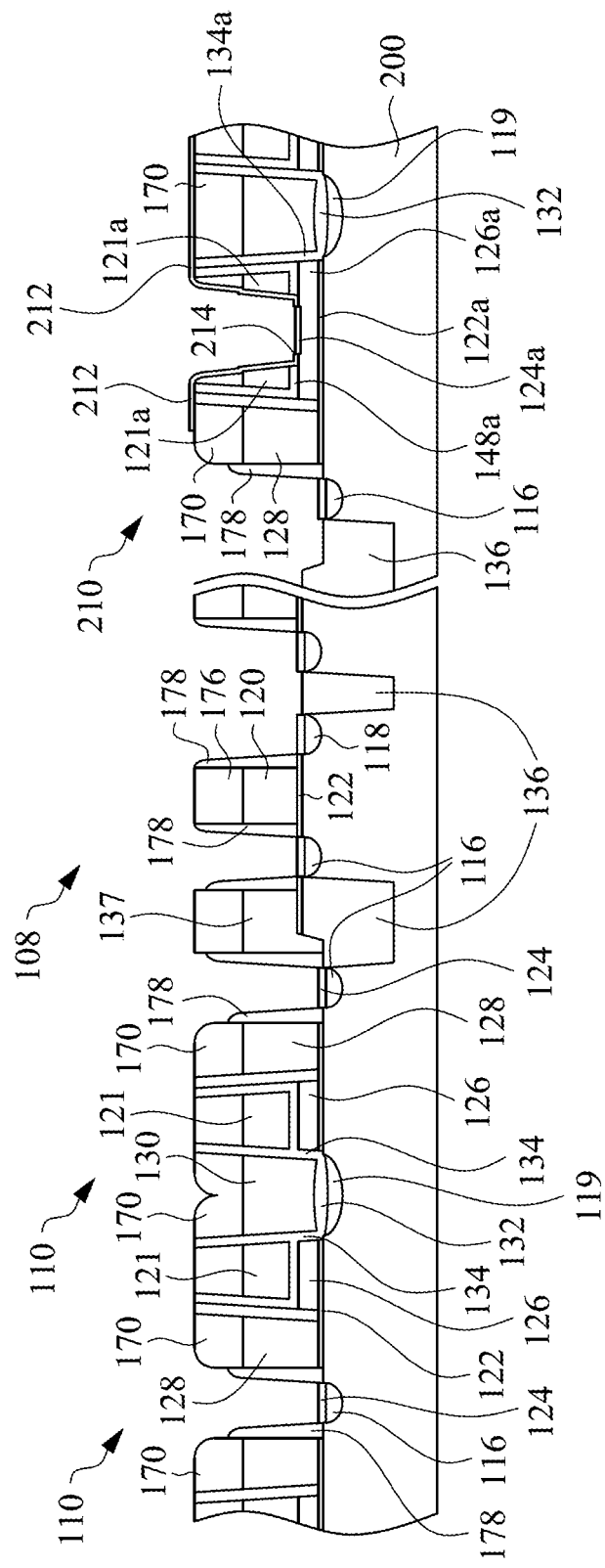

As shown in FIG. 5B, in accordance with embodiments described herein, following the deposit of the SPL 212, nickel is deposited and silicide contacts 124 are formed, substantially as previously described, including a silicide contact 124a in the window 214 of the SPL 212. In contrast to the monitor cell 160 described previously with respect to FIGS. 4A-4C, the SPL 212 seals the exposed surfaces of the control gate 121a, and blocks any formation of silicides on the control gate, without interfering with the formation of the silicide contact 124a on the floating gate 126a. The example process then proceeds to the stage shown in FIG. 5C, in which a CESL 180 is formed over the components and an ILD 182 is deposited over the wafer 200. A chemical/mechanical polish (CMP) process is performed as previously described, but because the formation of silicide deposits on the control gate 121a has been prevented, as explained above, no silicides are exposed by the CMP process, and silicide contamination is reduced or prevented.

FIG. 5D shows the portion of the wafer 200 that houses the monitor cell 210 at the manufacturing stage corresponding to the stage shown in FIG. 1. At the stage shown, an ILD 138 is deposited—incorporating, in the process, the ILD 182 described above—vias 140 are formed, and a first metal layer 144 is deposited and patterned to produce electrical traces 142 and connectors 146.

Figure 6:
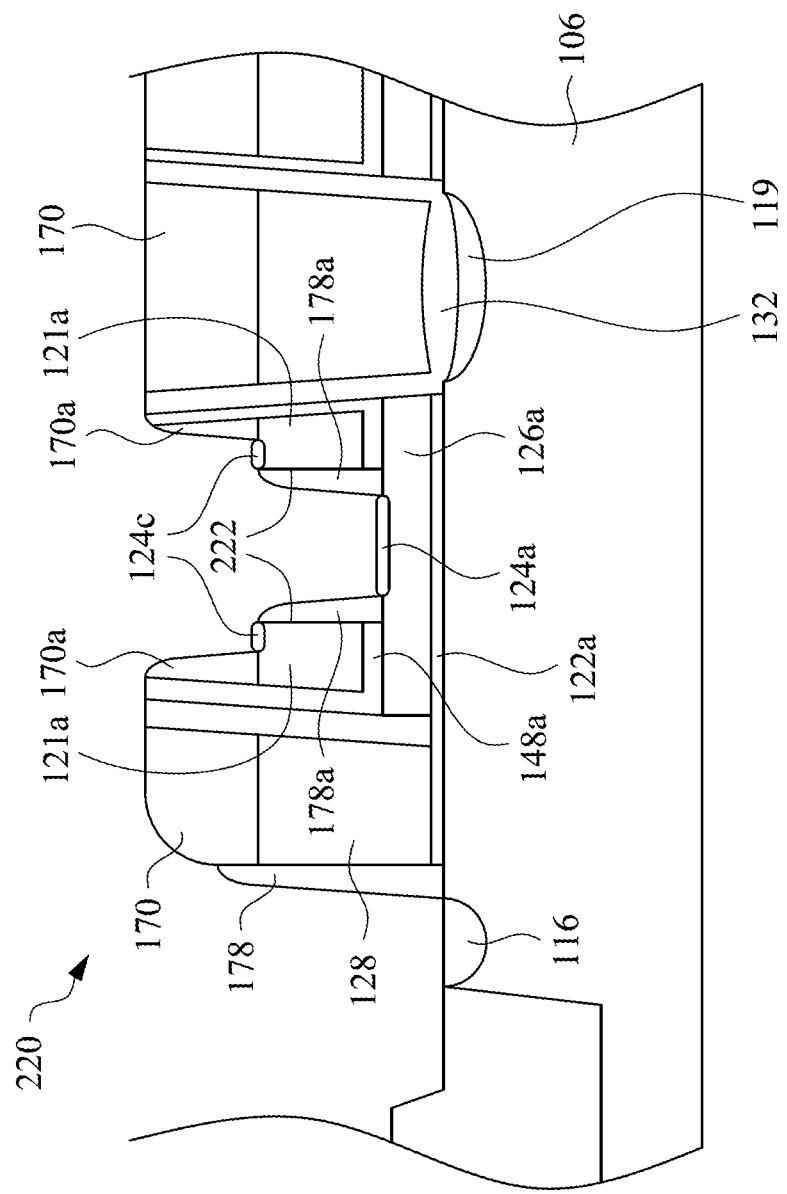
FIG. 6 is a diagrammatic side view of a monitor cell that is an alternative structure to the monitor cell of FIGS. 2A-4C, and is made using an alternate process to that described with reference to FIGS. 4A-4C, and corresponds to the manufacturing stage shown in FIG. 4B.

Referring to the aperture 162 of either the monitor 160, or the cell 210, as shown, for example in FIGS. 4A and 5A, it can be seen that an angle of the walls of the aperture, relative to a plane defined by the wafer substrate 106, is oblique. Depending upon the type of etch used to form the aperture, the walls may be oblique, as shown in previous drawings, or they may be a shallower angle, or closer to perpendicular, relative to the substrate. FIG. 6 is a diagrammatic side view of a monitor cell 220 that is an alternative structure to the monitor cell 160 of FIGS. 1-4C, and is made using an alternate process to that described with reference to FIGS. 4A-4C. Specifically, the view of FIG. 6 corresponds to the manufacturing stage shown in FIG. 4B, and shows some structural differences resulting from the alternate process.

In the alternate process used to produce monitor cell 220 of FIG. 6, the monitor cell 220 includes an aperture 222 extending through the control gate 121*a* and the underlying dielectric 148*a* to the floating gate 126*a*. The process employed to form the aperture 222 has produced sidewalls that are substantially perpendicular to a plane defined by the wafer substrate 106. As a result, in later process steps in which the spacers 178 are formed, spacers 178*a* are formed inside the aperture 222, covering the exposed vertical faces of the control gate 121*a*. However, the same processes that form the spacers 178 etch back the hard mask 170*a* covering remnants of the control gate 121*a*, leaving a small portion of the upper surface of the control gate 121*a* exposed. Thus, when the silicide contacts 124 are formed, silicide deposits 124*c* are formed on the small exposed portions of the upper surface of the control gate 121*a*, presenting the same possibility of silicide contamination as described previously with reference to the monitor cell 160.

Figure 5C:
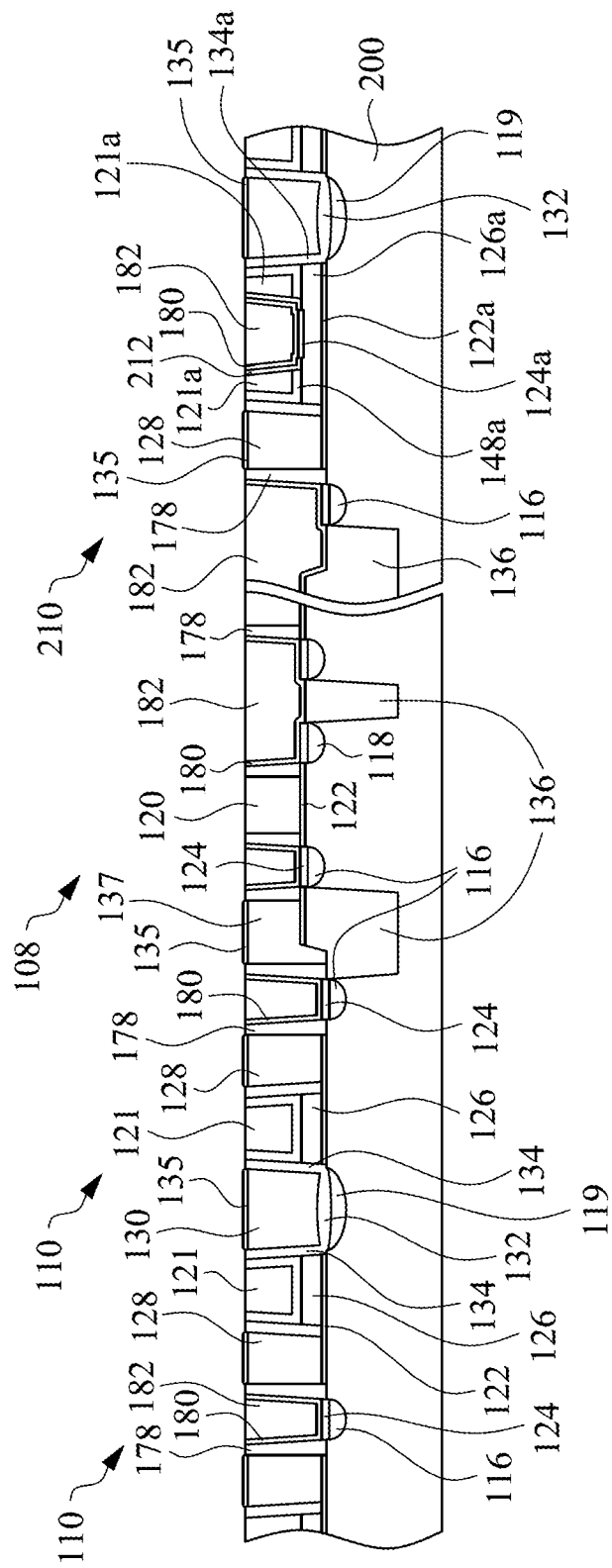
Figure 5D:
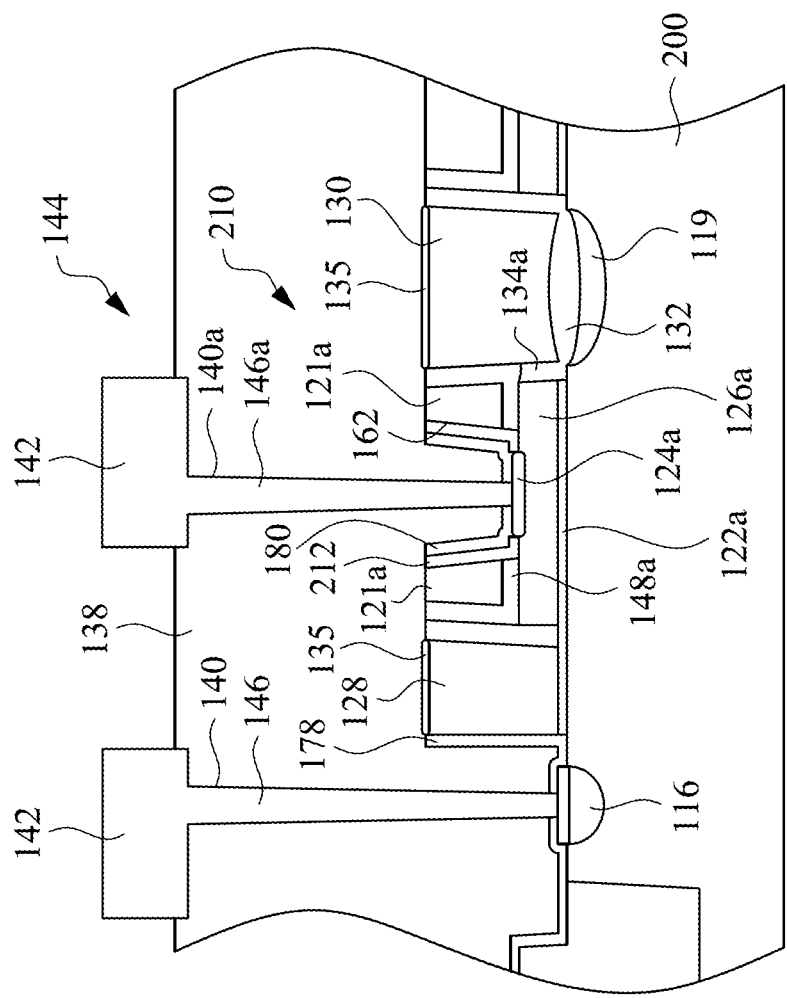
Figure 7:
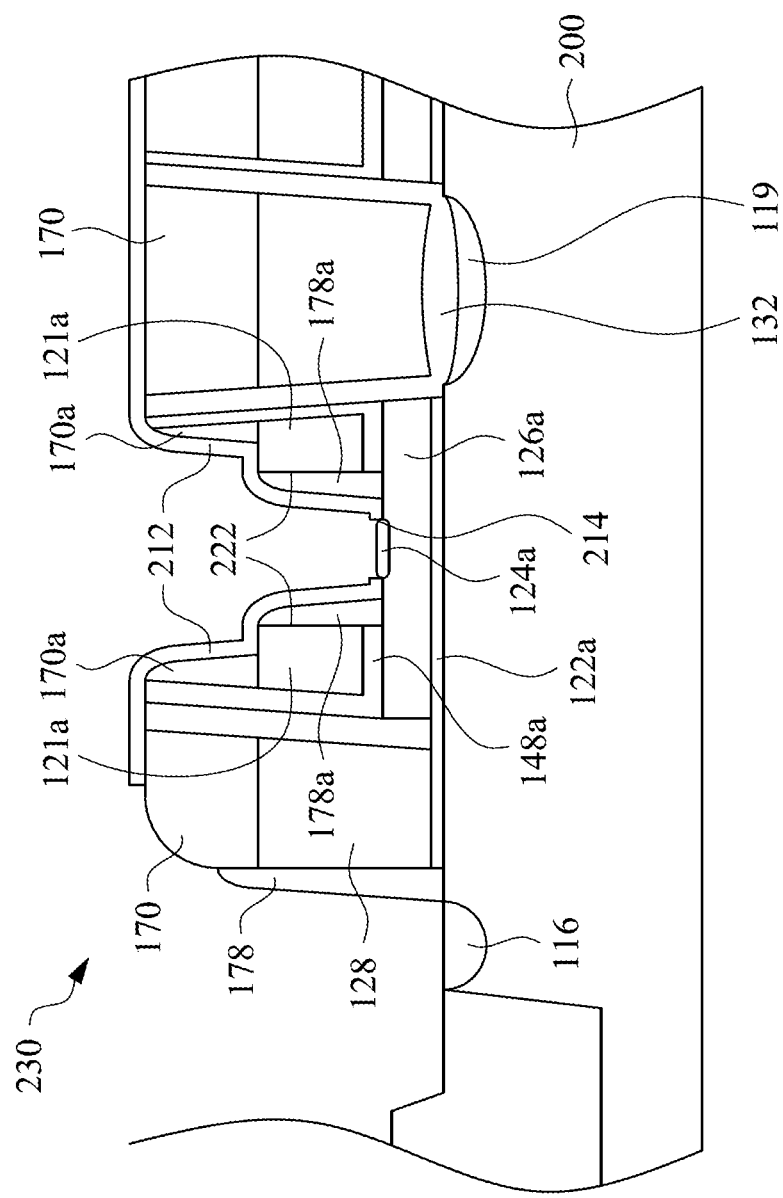
FIG. 7 is a diagrammatic side view of a monitor cell, according to an embodiment, that is an alternative structure to the monitor cell of FIGS. 5A-5D, corresponding, in particular, to the manufacturing stage shown in FIG. 5B.

FIG. 7 is a diagrammatic side view of a monitor cell 230, according to an embodiment, that is an alternative structure to the monitor cell 200 of FIGS. 5A-5C. The monitor cell 230 includes an aperture 222 made using the same alternate process used to form the aperture 222 of the monitor cell 220, as described with reference to FIG. 6. The view of FIG. 7 corresponds to the manufacturing stage shown in FIGS. 5B, and shows the formation of the spacers 178*a*, substantially as described with reference to the monitor cell 220 of FIG. 6. In the embodiment of FIG. 7, an SPL 212 is deposited over the monitor cell 230, sealing the exposed portions of the control gate 121*a*, and patterned to define a window 214, substantially as described with reference to FIG. 5A. Following the formation and patterning of the SPL 212, a silicide contact 124*a* is formed within the window 214, on the exposed surface of the floating gate 126*a*. The manufacturing process continues as described above with respect to FIG. 5C with the benefit of reduction or prevention of silicide contamination.

Figure 8:
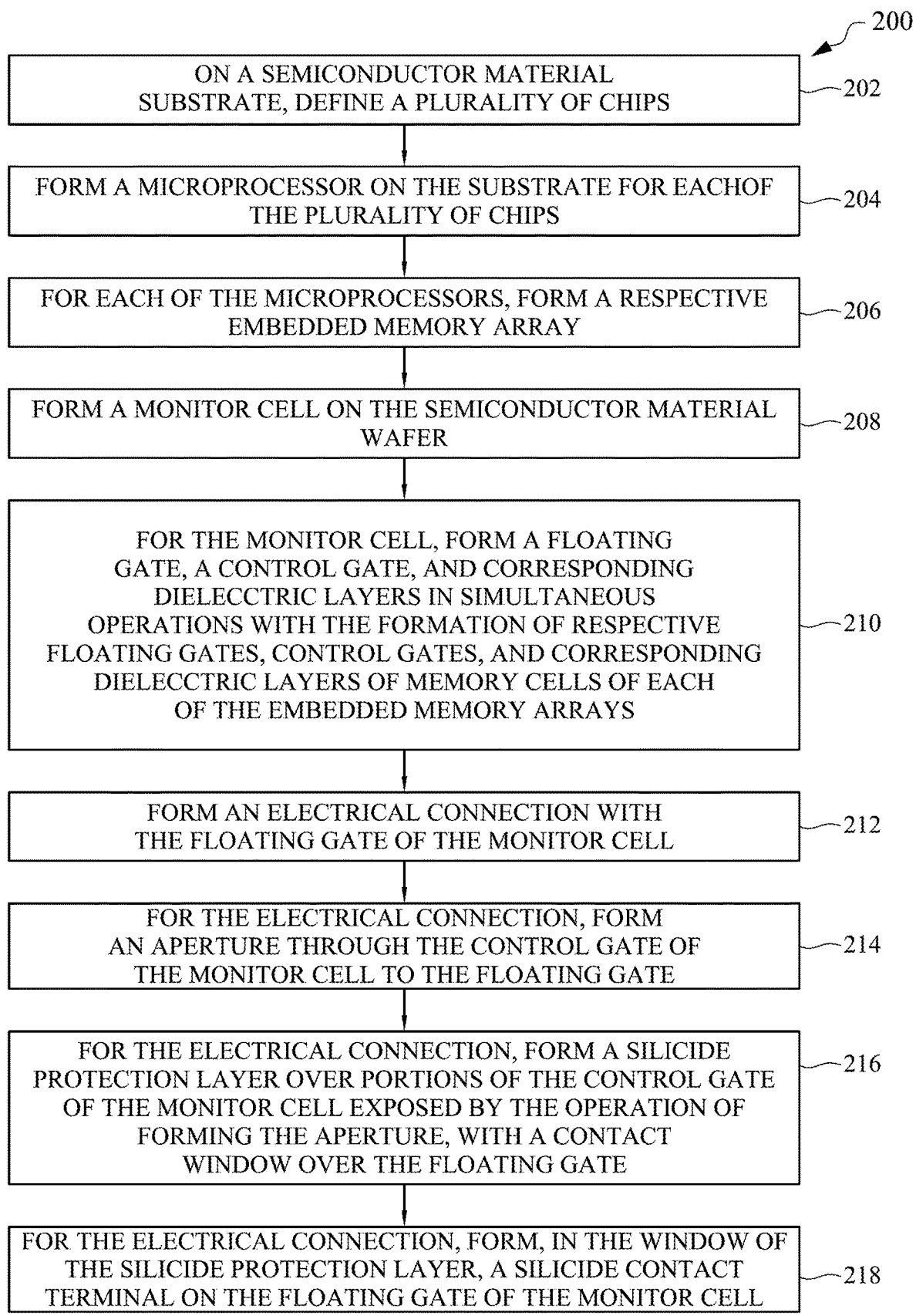
FIG. 8 is a flow chart outlining a method of manufacture, according to an embodiment, that is consistent with processes described with reference to FIGS. 5A-5D and 7.

FIG. 8 is a flow chart outlining a method of manufacture 300, according to an embodiment, that is consistent with processes described above with reference to FIGS. 5A-5D and 7. It will be understood that, although the process steps of the method 300 are shown in a sequence, they are not necessarily performed in the sequence shown, and in fact, many steps are, or can be performed simultaneously. For example, in step 302 a plurality of chips are defined on a semiconductor material substrate. In practice, specifically defined chips may not be discernible on the wafer until scribe lines are defined, which may occur during or after many other processed are performed. Accordingly, except as provided in the language or description, the order of operations is not limited to the order shown.

Proceeding to steps 304 and 306, a microprocessor is formed for each of the chips, and an embedded memory is formed for each microprocessor. A monitor cell is also formed, in steps 308-318. In step 310, a floating gate, a control gate, and corresponding dielectric layers of the monitor cell are formed simultaneously with the formation of floating gates, control gates, and corresponding dielectric layers of memory cells of each of the embedded memory arrays.

An electrical connection with the floating gate of the monitor cell is formed, in steps 312-318. In step 314, an aperture is formed that extends through the control gate of the monitor cell to the floating gate. An SPL is then formed, in step 316, over portions of the control gate of the monitor cell that are exposed by the formation of the aperture, with a window formed in the SPL over the floating gate. Finally, in step 318, a silicide contact terminal is formed on the floating gate of the monitor cell in the window of the SPL.

The embodiments shown and described herein provide improvements to a monitor cell formed to provide a means for testing the quality and specific characteristics of the dielectric layers that separate the floating gate of each memory cell from surrounding structures, particularly the channel region and, where used, an erase gate. The improvements include formation of a silicide prevention layer (SPL) within an aperture formed to provide electrical access to a floating gate of the monitor cell. In particular, the SPL is beneficial if, during formation of the aperture, materials are exposed that would be susceptible to silicide formation, and that might later be subject to a CMP process where such silicides can contaminate the surface of a semiconductor wafer, causing expensive defects. In accordance with embodiments of the present disclosure, the SPL is formed simultaneously with manufacturing processes used to form other devices on the wafer. Utilization of the SPL in accordance with embodiments described herein can reduce and/or prevent potentially costly contamination of semiconductor wafers during production.

In the embodiments described above, a monitor cell is formed in a scribe line of a wafer, simultaneously with the formation of memory arrays on each of a plurality of microchips of the wafer. According to another embodiment, monitor cells are formed on individual microchips, so that testing can be performed before or after the wafer has been cut into individual chips. According to a further embodiment, a memory cell of a memory array is modified by formation of a connector with the floating gate, to create a monitor cell within the memory array.

The structures shown and described above are provided merely as examples; there are many different configurations of memory cells, that employ a floating gate, including flash, EPROM, EEPROM, etc., as well as other floating gate MOSFET devices, many of which may benefit from the principles disclosed here, including formation of a corresponding monitor cell, and providing protection from silicide contamination.

In the embodiments shown here, the memory cells are structured such that electrons are passed onto the floating gate of each memory cell through a first dielectric layer (122), and removed via a second dielectric layer (134). In other embodiments, electrons pass onto and off of the floating gate through a same dielectric layer.

In some structures, formation of an aperture to access the floating gate may expose a different gate, element, or structure of a material on which a silicide may form, thus creating a danger of silicide contamination. Embodiments in accordance with the present disclosure, including the formation of an SPL in accordance with the described embodiments may find utility in these other structures.

The term floating gate refers to a transistor gate structure that is permanently electrically isolated, i.e., that has no direct electrical connection to an electrical circuit and that is structured so as to interact with a control gate and a channel region. However, where the term floating gate is used, in the present specification and claims to refer to an element of a monitor cell, it can also apply to a gate structure that is configured to be electrically connected with an electrical circuit, but that is manufactured simultaneously with the floating gate of at least one transistor structure formed on a same semiconductor wafer.

Ordinal numbers, e.g., first, second, third, etc., are used in the claims according to conventional claim practice, i.e., for the purpose of clearly distinguishing between claimed elements or features thereof, etc. Ordinal numbers may be assigned arbitrarily, or assigned simply in the order in which elements are introduced. The use of such numbers does not suggest any other relationship, such as order of operation, relative position of such elements, etc. Furthermore, an ordinal number used to refer to an element in a claim should not be assumed to correlate to a number used in the specification to refer to an element of a disclosed embodiment on which that claim reads, nor to numbers used in unrelated claims to designate similar elements or features.

According to an embodiment, a plurality of chips is defined on a semiconductor material wafer, such as, e.g., by formation of scribe lines on the semiconductor material wafer. A microprocessor device that includes an embedded flash memory is formed on each of the microchips. A monitor cell is formed on the wafer, with many elements of the monitor cell being formed simultaneously with corresponding elements of the memory cells of the memory arrays, including floating gates, control gates, and corresponding dielectric layers. An aperture is formed in the monitor cell, extending through the control gate to expose a portion of the floating gate. A silicide protection layer is then formed over portions of the control gate that are exposed by the process of forming the aperture. After the silicide protection layer is formed, a silicide contact terminal is formed on the portion of the floating gate exposed by the formation of the aperture, while the silicide protection layer prevents formation of silicide on the control gate.

According to another embodiment, a method is provided that includes the formation of a plurality of memory cells on a semiconductor material wafer. This includes forming a first dielectric layer of each of the plurality of memory cells adjacent to a channel region, forming a floating gate on a side of the first dielectric layer opposite the channel region, and forming a control gate adjacent to the floating gate and separated therefrom by a second dielectric layer.

The method also includes formation of a monitor cell on the semiconductor material wafer, including forming a first dielectric layer of the monitor cell simultaneously with forming the first dielectric layer of each of the plurality of memory cells, forming a floating gate of the monitor cell simultaneously with forming the floating gates of the plurality of memory cells, and forming a control gate of the monitor cell simultaneously with forming the control gates of the plurality of memory cells. An aperture is then formed through the control gate of the monitor cell and an intervening dielectric layer so as to expose a portion of the floating gate of the monitor cell. A silicide protection layer is then formed to cover any portions of the control gate that were exposed by the process of forming the aperture. After formation of the silicide protection layer a silicide contact terminal is formed on the exposed portion of the floating gate.

According to a further embodiment, a method is provided in which a plurality of substantially identical memory cells are formed on a semiconductor wafer. A monitor cell is also formed, by exposing a portion of a floating gate of one of the plurality of memory cells by forming an aperture in the one of the plurality of memory cells, extending to the floating gate. Finally, a silicide contact terminal is formed on the exposed portion of the floating gate. When, in addition to the exposed portion of the floating gate, another material is exposed by the forming an aperture, and the exposed material is susceptible to silicide formation, then, prior to the forming a silicide contact terminal, a silicide prevention layer is formed over the exposed material.

While the method and process steps recited in the claims may be presented in an order that corresponds to an order of steps disclosed and described in the specification, except where explicitly indicated, the order in which steps are presented in the specification or claims is not limiting with respect to the order in which the steps may be executed.

The abstract of the present disclosure is provided as a brief outline of some of the principles of the invention according to one embodiment, and is not intended as a complete or definitive description of any embodiment thereof, nor should it be relied upon to define terms used in the specification or claims. The abstract does not limit the scope of the claims.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a plurality of substantially identical memory cells on a semiconductor wafer;
   forming a monitor cell, including exposing a portion of a floating gate of one of the plurality of memory cells by forming an aperture in a portion of the one of the plurality of memory cells;
   forming a silicide contact terminal on the exposed portion of the floating gate; and
   when, in addition to the exposed portion of the floating gate, a material is exposed by the forming an aperture, and the exposed material is susceptible to silicide formation, prior to the forming a silicide contact terminal on the exposed portion of the floating gate, forming a silicide prevention layer over the exposed material.

2. The method of claim 1, wherein the forming a monitor cell comprises forming the one of the plurality of memory cells in a scribe line of the semiconductor wafer.

3. The method of claim 1, wherein:
the forming an aperture in a portion of the one of the plurality of memory cells comprises forming an aperture in a control gate of the one of the plurality of memory cells; and
the forming the silicide prevention layer over the exposed material comprises forming a silicide prevention layer over portions of the control gate exposed by the forming the aperture in the control gate of the one of the plurality of memory cells.

4. A method, comprising:
forming a first floating gate over a substrate, and a control gate over the first floating gate;
forming an aperture extending through the control gate and exposing a portion of the first floating gate;
forming a silicide protection layer over a surface of the control gate exposed by the forming the aperture; and
forming a silicide contact terminal on the portion of the first floating gate exposed by the forming the aperture.

5. The method of claim 4, wherein the silicide protection layer is a resist protective oxide.

6. The method of claim 4, comprising forming an electrical connector in the aperture.

7. The method of claim 6, wherein the electrical connector is formed to extend through the silicide protection layer.

8. The method of claim 4, comprising forming a plurality of memory cells on the substrate, each memory cell including a floating gate on a same layer as the first floating gate.

9. The method of claim 8, wherein the first floating gate is formed on a scribe line area on the substrate.

10. The method of claim 4, comprising forming a select gate and an erase gate on two sides of the first floating gate.

11. The method of claim 10, comprising forming a tunneling dielectric layer laterally between the first floating gate and the erase gate.

12. The method of claim 10, comprising forming a gate dielectric layer vertically between the first floating gate and the substrate.

13. The method of claim 12, wherein the select gate is formed on the gate dielectric layer.

14. A method, comprising:
forming a monitor cell on a semiconductor wafer, including:
forming a floating gate;
forming a control gate over the floating gate;
exposing a portion of the floating gate by forming an aperture through one or more structures over the floating gate;
forming a silicide protection layer directly on a sidewall of the aperture; and
forming an electrode that extends in the aperture and through the silicide protection layer.

15. The method of claim 14, comprising forming a silicide layer on the floating gate and in the aperture.

16. The method of claim 14, wherein the silicide protection layer is formed on a portion of the floating gate.

17. The method of claim 14, wherein the silicide protection layer is a resist protective oxide layer.

18. The method of claim 14, comprising forming a select gate laterally adjacent to both the control gate and the floating gate.

19. The method of claim 14, comprising forming a dielectric layer vertically between the control gate and the floating gate.

20. The method of claim 14, wherein the floating gate is formed on a scribe line area on the semiconductor wafer.

* * * * *